United States Patent [19]

Shuck et al.

[11] 4,300,108

[45] Nov. 10, 1981

[54] ELECTRICAL ATTENUATOR

[75] Inventors: Elmer E. Shuck, Whitesboro; Howard R. Stevenson, Jr., Herkimer, both of N.Y.

[73] Assignee: General Electric Company, Utica, N.Y.

[21] Appl. No.: 103,324

[22] Filed: Dec. 14, 1979

[51] Int. Cl.³ .............................................. H03H 7/25
[52] U.S. Cl. ................................ 333/81 R; 307/540
[58] Field of Search ................. 333/81 R, 81 A, 81 B

[56] References Cited

U.S. PATENT DOCUMENTS 3,765,020 10/1973 Seager et al. ................. 333/81 R X

OTHER PUBLICATIONS

Hewlett-Packard Solid State Devices Application Note 912, *An Attenuator Design Using PIN Diodes.*

*Primary Examiner*—Paul L. Gensler

[57] ABSTRACT

An attenuator for IF and RF electrical signals is disclosed comprising a digital mapping means which transforms a digital control word representing the amount of attenuation desired to a current gain control word and a voltage gain control word. The current gain control word causes a current gain means to impart a specific current through a control diode. A first voltage follower is used to measure the voltage imparted across the control diode. The voltage gain control word causes a voltage gain means to output a specific voltage to a summer which combines the specific voltage with the output voltage of the first voltage follower. The summed voltages are taken by a second voltage follower to the cathode of an attenuating diode, whose anode is connected to the signal to be attenuated.

10 Claims, 2 Drawing Figures

ELECTRICAL ATTENUATOR

The Government has rights in this invention pursuant to contract number F19628-76-C-0002 awarded by the Department of the Air Force.

BACKGROUND OF THE INVENTION

1. Field of the Invention

The present invention relates to an electrical attenuator and more specifically to one which can digitally control IF or RF signals levels by attenuating them.

2. Description of the Prior Art

Previous methods of driving a diode junction with a digital word have relied upon sophisticated networks or a high resolution digital to analog converter with a programmable read only memory, or a combination of the two, in order to produce a temperature compensated linear in db per step attenuator characteristic. There is difficulty in obtaining good temperature compensation with these approaches and they require much higher resolution digital to analog converters.

Accordingly, it is an object of the present invention to provide a relatively simple, low cost and more reliable means in which to perform the attenuation of electrical signals.

It is a further object of the invention to utilize the inherent attenuation characteristics of a diode junction to result in a very linear in db per step, repeatable, and basically temperature compensated attenuator.

BRIEF DESCRIPTION OF THE DRAWINGS

Various other objects, features and attendant advantages of the present invention will be more fully appreciated from the following detailed description when considered in connection with the accompanying drawings.

DESCRIPTION OF THE PREFERRED EMBODIMENT

Figure 1:
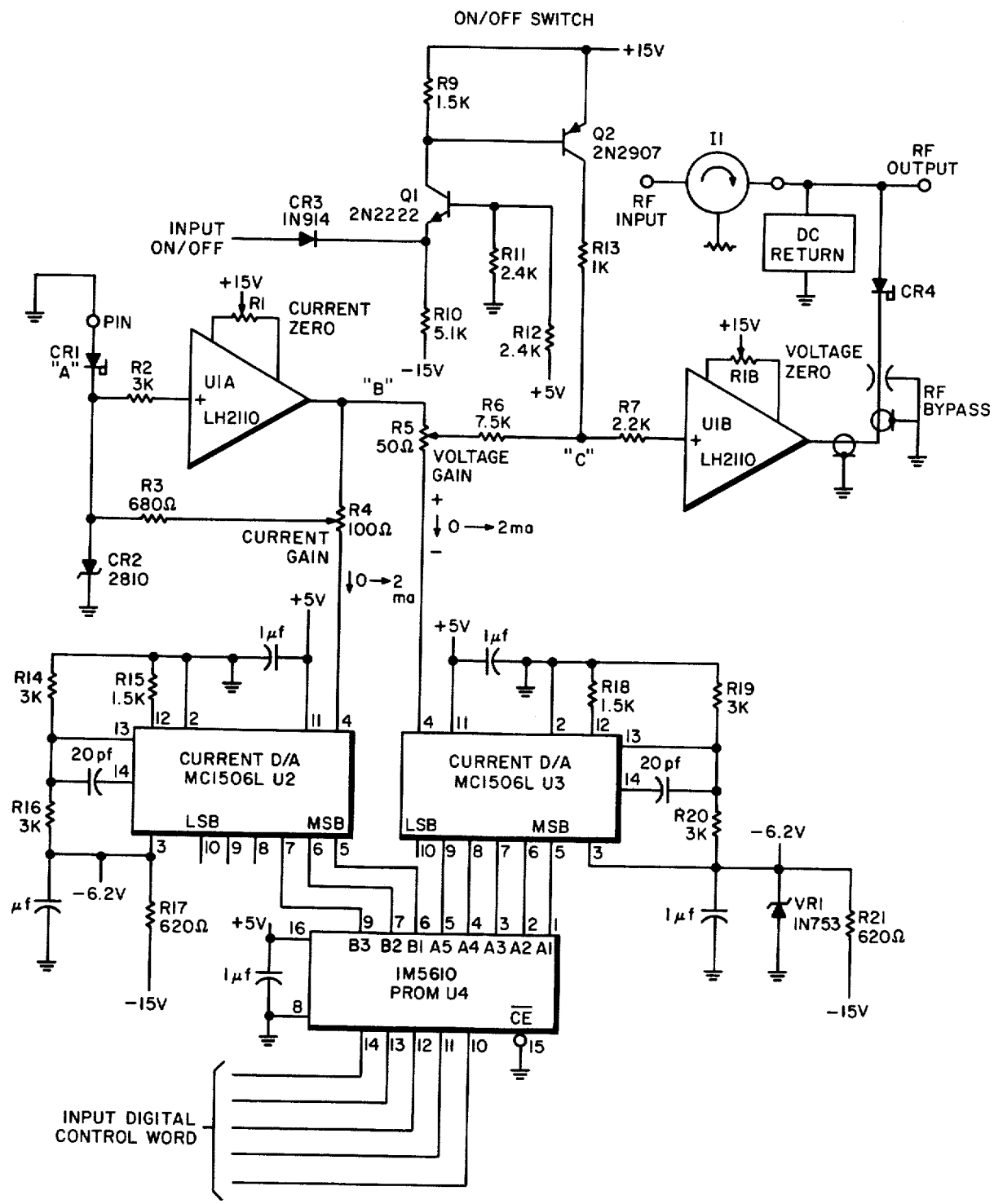
FIG. 1 is a schematic diagram of the present invention.

Referring now to the drawings, and more specifically to FIG. 1, thereof, the instant invention utilizes PIN diode, CR4, as the attenuating element. The control input is the input digital control word, corresponding to the amount of attenuation desired, to a programmable read only memory (PROM such as Intersil's Model IM5610), U4.

The PROM is a digital mapping means that has an input to output transfer function which allows a single input digital control word to generate two independent digital words as an output. One of the outputs is a current gain control word denoted by bits B1, B2 and B3 and the other is a voltage gain control word denoted by A1, A2, A3, A4 and A5, illustrated in Table I.

TABLE I

| Input Digital Control Word | Current Control Word | | | Voltage Gain Control Word | | | | |
|---|---|---|---|---|---|---|---|---|
| | B1 | B2 | B3 | A1 | A2 | A3 | A4 | A5 |
| 00000 | 0 | 0 | 0 | 0 | 0 | 0 | 0 | 0 |
| 00001 | 0 | 0 | 1 | 0 | 0 | 0 | 0 | 0 |
| 00010 | 0 | 1 | 0 | 0 | 0 | 0 | 0 | 0 |
| 00011 | 0 | 1 | 1 | 0 | 0 | 0 | 0 | 0 |
| 00100 | 1 | 0 | 0 | 0 | 0 | 0 | 0 | 0 |
| 00101 | 1 | 0 | 1 | 0 | 0 | 0 | 0 | 0 |
| 00110 | 1 | 1 | 0 | 0 | 0 | 0 | 0 | 0 |
| 00111 | 1 | 1 | 0 | 0 | 0 | 0 | 0 | 1 |
| 01000 | 1 | 1 | 1 | 0 | 0 | 0 | 1 | 0 |
| 01001 | 1 | 1 | 1 | 0 | 0 | 0 | 1 | 1 |
| 01010 | 1 | 1 | 0 | 0 | 0 | 1 | 0 | 0 |
| 01011 | 1 | 1 | 0 | 0 | 0 | 1 | 0 | 1 |
| 01100 | 1 | 1 | 0 | 0 | 0 | 1 | 1 | 0 |
| 01101 | 1 | 1 | 0 | 0 | 0 | 1 | 1 | 1 |
| 01110 | 1 | 1 | 0 | 0 | 1 | 0 | 0 | 0 |
| 01111 | 1 | 1 | 0 | 0 | 1 | 0 | 0 | 1 |
| 10000 | 1 | 1 | 0 | 0 | 1 | 0 | 1 | 0 |
| 10001 | 1 | 1 | 0 | 0 | 1 | 0 | 1 | 1 |
| 10010 | 1 | 1 | 0 | 0 | 1 | 1 | 0 | 0 |
| 10011 | 1 | 1 | 0 | 0 | 1 | 1 | 0 | 1 |
| 10100 | 1 | 1 | 0 | 0 | 1 | 1 | 1 | 0 |
| 10101 | 1 | 1 | 0 | 0 | 1 | 1 | 1 | 1 |
| 10110 | 1 | 1 | 0 | 1 | 0 | 0 | 0 | 0 |
| 10111 | 1 | 1 | 0 | 1 | 0 | 0 | 0 | 1 |
| 11000 | 1 | 1 | 0 | 1 | 0 | 0 | 1 | 0 |
| 11001 | 1 | 1 | 0 | 1 | 0 | 0 | 1 | 1 |
| 11010 | 1 | 1 | 0 | 1 | 0 | 1 | 0 | 0 |
| 11011 | 1 | 1 | 0 | 1 | 0 | 1 | 0 | 1 |
| 11100 | 1 | 1 | 0 | 1 | 0 | 1 | 1 | 0 |
| 11101 | 1 | 1 | 0 | 1 | 0 | 1 | 1 | 1 |
| 11110 | 1 | 1 | 0 | 1 | 1 | 0 | 0 | 0 |
| 11111 | 1 | 1 | 0 | 1 | 1 | 0 | 0 | 1 |

The current gain control word and the voltage gain control word are fed into digital to analog (D/A) converters U2 and U3, respectively. This method of control takes advantage of the inherent attenuation characteristics of a diode junction and results in a very linear in attenuation (db) per current and/or voltage step, repeatable, and basically temperature compensated attenuator.

Figure 2:
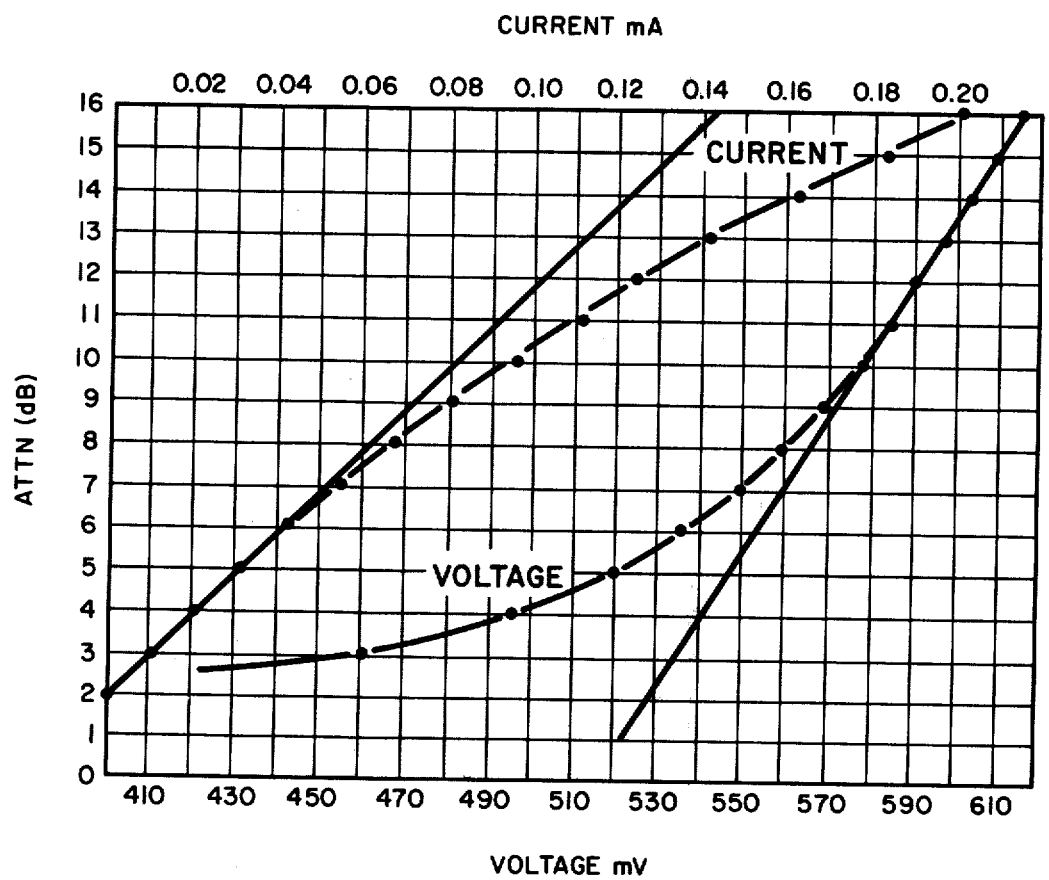
FIG. 2 includes 2 graphs of Attenuation vs. Current and Attenuation vs. Voltage for a Ku band waveguide attenuator composed of a PIN diode.

The overall attenuation characteristic of PIN diode, CR4, connected in parallel across a transmission line carrying IF or RF energy is made up of two different characteristics as a function of the current and voltage. As shown in FIG. 2, starting with no drive current to some small level of current, the attenuation characteristic is linear in db per milliamp of current. After a transition region, the attenuation characteristic becomes linear in db per millivolt of control voltage. In the transition region, from approximately 6 to 11 db, without the control circuitry to the left of CR4 operating, the attenuation chracteristic with respect to both current and voltage is nonlinear.

PIN diode, CR4, performs the function of a shunt variable resistor and it could just as well be connected across a waveguide, coax or across an IF or RF line. The resistance of the PIN diode as it turns on is controlled by the amount of current passing through it.

During the initial part of the attenuation characteristic (2 to 6 db), diode CR4 acts as a loss across the line with the match remaining fairly reasonable; that is, the power is basically absorbed in the shunt element and very little of it is reflected. The RF bypass functions as an RF trap so that the energy into the diode cannot leak out of the drive input line. The D.C. return provides a ground to the anode of CR4 for the drive signal while preventing the RF energy being attenuated from leaking to ground. The dc return could be provided by isolator I1 or by other circuitry external to applicant's invention. As the current increases from zero, the attenuation will become nonlinear (greater than 6 db) when the diode's mode of operation changes from absorbing the bulk of the power, to reflecting more and more of it. Since the transmission line is intended to operate with the power flowing in one direction only, an isolator, I1, may be required to absorb the reflected energy.

The purpose of an attenuator is to control the power flow between the RF (or IF) input and RF (or IF) output of FIG. 1. The attenuator should be linear in db with respect to each unit step or consecutive digital control word.

After the designer has plotted the attenuation characteristic as shown in FIG. 2, he must determine how many unit steps or consecutive input digital control words to use. The attenuator of FIG. 1 has been designed with 32 consecutive input digital control words, or unit steps, representing a five bit control word.

During the initial linear portion of the attenuation characteristic (2 to 6 db), the current gain control word is fed into digital-to-analog converter U2, causing a current flow through diode CR1. The output current from U2, the Motorola Semiconductor model MC 1506L digital to analog converter, varies from 0 to 2 milliamps.

The U2 output current flows through R4, a 100 ohm potentiometer, and R3 going to a point "A" thereby providing a current split. The one time adjustment of the potentiometer is necessary for a current split of approximately 20:1 because diode CR1 is limited to accepting a 0.1 milliamp maximum current instead of the full 2 milliamps from U2.

Diode CR2 doesn't have any function when the circuit is in its normal operation. If CR2 were not present during the initial adjustments of circuit parameters, e.g., potentiometers R4 and R1, and anything is misadjusted there may be no source of current to keep CR1 conducting and point "A" could go to the positive power supply level and the circuit could latch in that state.

A U2 operates to control the current through CR1 during the first part of the attenuation vs. current curve of FIG. 2, a voltage is generated across diode CR1. This voltage is tapped at point "A" by voltage follower U1A so that the voltage at point "B" is exactly equal to the voltage at "A". "Current Zero" (R1) is used to adjust the input to output offset of U1A to zero.

Another potentiometer R5 is connected to sum the voltage at point "B" with the voltage produced by the output current from U3 flowing through potentiometer R5 so that the correct attenuation can be obtained in the transition region and other linear region of the attenuation curve. During the first linear portion of the attenuation curve, there will be no current produced by U3. In all portions of the attenuation curve voltage follower U1B will keep its output voltage equal to that at point "B" without loading the input at all. "Voltage Zero" (R1B) is used to adjust the input to output offset of U1B to zero. U1B can also be realized with the same National Semiconductor Model LH 2110 integrated circuit since that model has two voltage followers in its package. It should be noted that the components attached to U1A, U1B, U2, U3 and U4 are necessary for bias and compensation purposes.

By U1B impressing the same voltage across the attenuating diode CR4, as was generated across CR1, the current through both diodes is the same. As long as the current passing through diode CR4 is less than 0.05 microamps, CR4 will be linearly attenuating the RF or IF input signal.

During the transition region and linear with voltage region of the attenuation curve, digital-to-analog converter U3 increases its output current as the input digital control word value is increased. This has the effect of having a portion of R5 increase in voltage so that the voltage at point "C" increases with each increase in the input digital control word step. U1B passes along this increase in voltage across diode CR4 until the CR4 acts as an attenuator characterized by its linear attenuation curve above 580 millivolts. In the transition region from approximately 440–580 millivolts, the designer must select by trial and error a current gain control word and a voltage gain control word that will provide a linear attenuation for each increase in the input digital control word. Such a set of control words are illustrated in Table I. The trial and error procedure is necessary because when you increase the current from U2 you will be in a non-linear region of the attenuation curve and you will have to increase the current from U3 (thereby increasing the voltage at R5). The procedure may continue further because the voltage at R5 is not quite linear so it may be necessary to increase or decrease the current from U2 again. This procedure is continued until a linear attentuation per step is achieved.

It should be mentioned that the on-off circuitry attached to point "C" between R6 and R7 is really not required for the invention to operate, but is an added feature to assure an absolute minimum attenuation. The absolute minimum attenuation that can be realized from a PIN diode is obtained when the diode is back biased. The on-off circuitry can back-bias CR4 independent of what the other parts of the circuit are trying to do.

A 15 volt back bias voltage appears at point "C" when a TTL logic 0 signal appears at the input on-off point at the anode of CR3, and CR4 is not back biased when a TTL logic 1 signal appears at the input on-off point.

While a preferred embodiment of the invention has been shown and described, various other embodiments and modifications thereof will become apparent to persons skilled in the art, and will fall within the scope of invention as defined in the following claims.

Having thus described the invention, what is claimed as new and desired to be secured by Letters Patent of the United States is:

1. A signal attenuator for an IF or RF signal comprising:
   a. a digital mapping means capable of receiving at least one digital control word corresponding to an amount of attenuation desired and outputting at least one digital current gain control word and at least one digital voltage gain control word;
   b. a current gain means receiving said digital current gain control word and converting it into a first analog current;
   c. a control diode having its anode end connected to a ground potential and its cathode end connected to said current gain means so as to receive said first analog current;
   d. a first voltage follower having its input connected to the cathode of said control diode so as to measure a first voltage, said first voltage being the voltage generated across said control diode;
   e. a voltage gain means receiving said digital voltage gain control word and converting it into a second voltage;
   f. a summing means having an output which represents the sum of said first and second voltages;

g. a second voltage follower having an input and output, said input being connected to the output of said summing means;

h. an attenuating diode having its cathode connected to the output of said second voltage follower and having its anode connected to said signal.

2. The invention of claim 1 further comprising an override means connected to the input of said second voltage follower wherein said override means back biases the attenuating diode for minimum attenuation thereby overriding the operation of said current gain means and said voltage gain means.

3. The invention of claim 1 further comprising a third diode having its anode connected to the cathode of said control diode and having its cathode connected to a ground potential.

4. The invention of claim 1 further comprising an RF bypass network connected to the cathode of said attenuating diode.

5. The invention of claim 1 further comprising an isolator connected between said signal and said anode of said attenuating diode wherein said isolator absorbs any reflected power.

6. A signal attenuator for an IF or RF signal comprising:

a. a programmable read only memory capable of receiving at least one digital control word corresponding to an amount of attenuation desired and outputting at least one digital current gain control word and at least one digital voltage gain control word;

b. a first digital to analog converter receiving said digital current gain control word and converting it into a first analog current;

c. a control diode having its anode end connected to a ground potential and its cathode end connected to said first digital to analog converter so as to receive said first analog current;

d. a first voltage follower having its input connected to the cathode of said control diode so as to measure a first voltage, said first voltage being the voltage generated across said control diode;

e. second digital to analog converter receiving said digital voltage gain control word and converting it into a second voltage;

f. a summing means having an output which represents the sum of said first and second voltages;

g. a second voltage follower having an input and an output, said input being connected to the output of said summing means;

h. an attenuating diode having its cathode connected to the output of said second voltage follower and having its anode connected to said signal.

7. The invention of claim 6 further comprising an override means connected to the input of said second voltage follower, wherein said override means back biases the attenuating diode for minimum attenuation thereby overriding the operation of said first and said second digital to analog converters.

8. The invention of claim 6 further comprising a third diode having its anode connected to the cathode of said control diode and having its cathode connected to a ground potential.

9. The invention of claim 6 further comprising an RF bypass network connected to the cathode of said attenuating diode.

10. The invention of claim 6 further comprising an isolator connected between said signal and said anode of said attenuating diode wherein said isolator absorbs any reflected power.

* * * * *